(12) United States Patent
Aoki et al.

(10) Patent No.: US 11,181,704 B2
(45) Date of Patent: Nov. 23, 2021

(54) FABRICATION METHOD OF HIGH ASPECT RATIO SOLDER BUMPING WITH STUD BUMP AND INJECTION MOLDED SOLDER, AND FLIP CHIP JOINING WITH THE SOLDER BUMP

(71) Applicant: INTERNATIONAL BUSINESS MACHINES CORPORATION, Armonk, NY (US)

(72) Inventors: Toyohiro Aoki, Kanagawa (JP); Takashi Hisada, Tokyo (JP); Eiji Nakamura, Kanagawa (JP); Masao Tokunari, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/744,996

(22) Filed: Jan. 16, 2020

(65) Prior Publication Data
US 2020/0150362 A1 May 14, 2020

Related U.S. Application Data

(62) Division of application No. 15/801,763, filed on Nov. 2, 2017, now Pat. No. 10,598,874.

(51) Int. Cl.
*G02B 6/42* (2006.01)
*H01L 23/00* (2006.01)
(Continued)

(52) U.S. Cl.
CPC ....... *G02B 6/4232* (2013.01); *G02B 6/12002* (2013.01); *G02B 6/1221* (2013.01);
(Continued)

(58) Field of Classification Search
CPC .. G02B 6/1221; G02B 6/4201; G02B 6/4214; G02B 6/4219; G02B 6/4228;
(Continued)

(56) References Cited

U.S. PATENT DOCUMENTS 8,820,612 B2  9/2014 Feger et al.
9,354,408 B2  5/2016 Noma et al.
(Continued)

FOREIGN PATENT DOCUMENTS

CN  104900547 A  9/2015
EP  2180505 A2  4/2010

OTHER PUBLICATIONS

International Search Report and Written Opinion issued in International Application No. PCT/ IB2018/058363 dated Feb. 13, 2019, pp. 1-10.
(Continued)

*Primary Examiner* — Michael P Mooney
(74) *Attorney, Agent, or Firm* — Tutunjian & Bitetto, P.C.; Randall Bluestone

(57) ABSTRACT

A technique for fabricating bumps on a substrate is disclosed. A substrate that includes a set of pads formed on a surface thereof is prepared. A bump base is formed on each pad of the substrate. Each bump base has a tip extending outwardly from the corresponding pad. A resist layer is patterned on the substrate to have a set of holes through the resist layer. Each hole is aligned with the corresponding pad and having space configured to surround the tip of the bump base formed on the corresponding pad. The set of the holes in the resist layer is filled with conductive material to form a set of bumps on the substrate. The resist layer is stripped from the substrate with leaving the set of the bumps.

20 Claims, 12 Drawing Sheets

(51) Int. Cl.
| | |
|---|---|
| *G02B 6/122* | (2006.01) |
| *G02B 6/12* | (2006.01) |
| *G02B 6/13* | (2006.01) |
| *H01L 21/027* | (2006.01) |
| *H01L 33/62* | (2010.01) |
| *H01L 33/58* | (2010.01) |
| *H01L 31/02* | (2006.01) |
| *H01L 31/0232* | (2014.01) |

(52) U.S. Cl.
CPC ............ *G02B 6/13* (2013.01); *G02B 6/4214* (2013.01); *H01L 21/027* (2013.01); *H01L 24/11* (2013.01); *H01L 24/13* (2013.01); *H01L 24/16* (2013.01); *H01L 24/81* (2013.01); *G02B 2006/12069* (2013.01); *G02B 2006/12123* (2013.01); *H01L 24/05* (2013.01); *H01L 31/02005* (2013.01); *H01L 31/02327* (2013.01); *H01L 33/58* (2013.01); *H01L 33/62* (2013.01); *H01L 2224/0401* (2013.01); *H01L 2224/05124* (2013.01); *H01L 2224/05147* (2013.01); *H01L 2224/11005* (2013.01); *H01L 2224/1134* (2013.01); *H01L 2224/1141* (2013.01); *H01L 2224/1181* (2013.01); *H01L 2224/11602* (2013.01); *H01L 2224/11618* (2013.01); *H01L 2224/13023* (2013.01); *H01L 2224/1357* (2013.01); *H01L 2224/13139* (2013.01); *H01L 2224/13144* (2013.01); *H01L 2224/13147* (2013.01); *H01L 2224/13582* (2013.01); *H01L 2224/13664* (2013.01); *H01L 2224/16237* (2013.01); *H01L 2224/81191* (2013.01); *H01L 2224/81815* (2013.01); *H01L 2924/12041* (2013.01); *H01L 2924/12043* (2013.01); *H01L 2933/0066* (2013.01)

(58) Field of Classification Search
CPC ........ G02B 6/4232; G02B 2006/12069; G02B 2006/12123; H01L 24/05; H01L 24/08; H01L 24/11; H01L 24/13; H01L 24/14; H01L 24/16; H01L 24/81; H01L 31/02005; H01L 31/02327; H01L 33/58; H01L 33/62; H01L 2224/01; H01L 21/70; G02F 1/00
USPC .............................. 385/14; 438/31, 614, 612
See application file for complete search history.

(56) References Cited

U.S. PATENT DOCUMENTS

| | | |
|---|---|---|
| 9,859,241 B1 | 1/2018 | Aoki et al. |
| 2012/0252168 A1* | 10/2012 | Nah ........................ H01L 24/16 438/124 |
| 2013/0305633 A1 | 11/2013 | Hurley |
| 2014/0065771 A1 | 3/2014 | Graber et al. |
| 2014/0170816 A1 | 6/2014 | Nah et al. |
| 2014/0231977 A1 | 8/2014 | Kalandar et al. |
| 2016/0118358 A1 | 4/2016 | Dang et al. |
| 2017/0179059 A1 | 6/2017 | Yao et al. |

OTHER PUBLICATIONS

Mukawa, J. et al., "Development of liquid photoresisi for IMS (Injection Molded Solder) with high thermal stability" JSR Technical Review (Sep. 2014) pp. 11-18, No. 124/2017.
List of IBM Patents or Patent Applications Treated as Related dated Jan. 16, 2020, 2 pages.

* cited by examiner

FABRICATION METHOD OF HIGH ASPECT RATIO SOLDER BUMPING WITH STUD BUMP AND INJECTION MOLDED SOLDER, AND FLIP CHIP JOINING WITH THE SOLDER BUMP

BACKGROUND

Technical Field

The present disclosure, generally, relates to bumping technology, more particularly, to a method of fabricating bumps on a substrate, a structure including bumps formed on a semiconductor device or substrate, and an electronic device including bumps formed on a semiconductor device. The present invention also relates to a method of interconnecting a semiconductor device with external circuitry by bumps.

Related Art 3D and 2.5D packaging is technology that enables wide band signal transmission and short wiring length, and it has been attracted attention for improving the performance of the computer systems in the future. Since the bump pitch and the bump size in the 3D and 2.5D packaging technology become fine in comparison with those of the conventional flip-chip technology, reliability issues due to the stress on the joint and its interface and the electro-migration caused by high current density have arisen.

Optimization of solder composition including adding a trace amount of additives is one of the solutions to improve mechanical characteristics and resistance for electro-migration occurred at the joint. One of techniques that have an ability to control the solder composition readily is IMS (Injection Molded Solder) technology. The IMS is technology that forms solder bumps on a substrate such as a wafer by injecting molten solder into holes in a resist mask. The IMS technology can support fine pitches.

In relation to the IMS technology, a direct injection molded solder process for forming solder bumps on wafers has been developed (US patent Application US 2016/0118358). In the process, copper pillars or ball limiting metallurgy (BLM) are formed over I/O pads within the channels of a patterned mask layer. Solder is injected over the pillars or BLM, filling the channels. Molten solder can be injected in cavities formed in round wafers without leakage using a carrier assembly that accommodates wafers that have been previously subjected to mask layer deposition and patterning.

Meanwhile, there is a demand for fabricating bumps with high aspect ratio in some applications. For example, in optical multi-chip module (optical MCM), which has an electronic device and an optoelectronic device integrated into a single package, a waveguide layer with a relatively large thickness (~75 micrometers) is formed on an organic substrate. Such thick waveguide may require high aspect bumps.

However, it is difficult to form a solder high on the pillar by conventional technologies, including micro-ball mounting and electroplating. Even though void free is known to be generally expected with the IMS technology, the IMS technology suffers from a difficulty that solder filling is encumbered by the residual gas in the high aspect holes in the resist mask, resulting in a low solder filling yield. The residual gas in the hole prevents the solder material from reaching the pillar and wetting on the top face of the pillar.

Therefore, there is a need for a novel bumping technique capable of obtaining bumps on a substrate with a high aspect ratio and a sufficient amount of conductive material efficiently.

SUMMARY

According to an embodiment of the present invention, a method for fabricating bumps on a substrate is provided. The method includes preparing a substrate that includes a set of pads formed on a surface thereof. The method also includes forming a bump base on each pad of the substrate. Each bump base has a tip extending outwardly from the corresponding pad. The method includes patterning a resist layer on the substrate to have a set of holes through the resist layer. Each hole is aligned with the corresponding pad and has space configured to surround the tip of the bump base formed on the corresponding pad. The method further includes filling the set of the holes with conductive material to form a set of bumps on the substrate. The method includes further stripping the resist layer from the substrate with leaving the set of the bumps.

The method according to the embodiment of the present invention can fabricate bumps with a higher aspect ratio and a sufficient amount of conductive material efficiently.

In a preferable embodiment, the conductive material is solder material and injected into each hole in molten state. The set of the bumps is a set of solder capped bumps, each of which is made of material of the bump base that is formed on the substrate and the solder material that is filled into the hole.

Thus, the tip of the bump base would touch the molten solder in the hole at the beginning of the filling, making it easier for the molten solder to wet the top of the tip and enter the hole. Therefore, filling yield of the solder material in the holes is expected to be improved. Also, since the amount of the solder material in the bump is expected to be sufficient, higher reliability of electrical connections using the bumps can be expected even though no pre-solder is formed. Furthermore, the bumps can have appropriate solder composition since each bump is fabricated by injecting the molten solder, which can be selected with the high degree of freedom regarding composition. Therefore, it becomes easier to optimize the solder composition to improve mechanical characteristics and/or resistance for electro-migration at electrical connections.

In a preferable embodiment, each bump base is a stud bump formed by wire bonding. Thereby, the production cost of the bumps can be reduced since expensive electroplating of a pillar base can be made unnecessary and complicated management of the plating process can be omitted.

In a preferable embodiment, each stud bump is a Cu stud bump having a protection layer formed on a surface thereof. Thereby, the bump base is allowed for maintaining its shape well against the diffusion into the solder material, making it easier for the bumps to keep their shape of high aspect ratio during a subsequent chip joining process. Also oxide removal process to improve surface wettability for the solder material can be omitted.

According to another embodiment of the present invention, a method for interconnecting a semiconductor device with external circuitry by bumps is provided. The method includes performing the aforementioned method to prepare a semiconductor device including at least a part of the set of the bumps formed on the surface of the substrate. The method also includes preparing external circuitry that has a set of electrodes formed on a surface thereof. The method further includes mounting the semiconductor device to the external circuitry such that the bumps of the semiconductor device are in contact with the electrodes of the external circuitry, respectively.

The electrical connections made by the method according to the other embodiment of the present invention can have a higher reliability owing from the high aspect ratio of the bumps and the sufficient amount of conductive material.

In a preferable embodiment, the bumps of the semiconductor device includes a set of solder capped bumps, each of which is made of material of the bump base and solder material. Since the amount of the solder material in the bump is expected to be sufficient, higher reliability of the electrical connections can be expected even though no pre-solder is formed on the electrodes. Furthermore, it becomes easier to optimize the solder composition to improve mechanical characteristics and/or resistance for electro-migration at electrical connections.

In a particular embodiment, the external circuitry has a layer that has a set of via holes aligned with the electrodes. The bumps of the semiconductor device are inserted into the via holes of the external circuitry, respectively, when mounting the semiconductor device to the external circuitry.

According to further embodiments of the present invention, a method for interconnecting a semiconductor device with external circuitry by bumps is provided. The method includes preparing a semiconductor device that includes a set of pads formed on a surface thereof and a set of bumps formed thereon. Each bump includes bump base material and conductive material formed thereon. The bump base material has at least a part protruding outwardly from the corresponding pad into the conductive material. The conductive material has a round top and a straight sidewall. The method also includes preparing external circuitry that has a set of electrodes formed on a surface thereof. The method further includes mounting the semiconductor device to the external circuitry such that the bumps of the semiconductor device are in contact with the electrodes of the external circuitry, respectively.

The electrical connections made by the method according to the further embodiment of the present invention can have a higher reliability.

According to a further other embodiment of the present invention, a structure including a semiconductor device that includes a set of pads formed on a surface thereof and a set of bumps formed on the pads is provided. Each bump includes bump base material and conductive material formed thereon. The bump base material has at least a part protruding outwardly from the corresponding pad into the conductive material. The conductive material has a round top and a straight sidewall.

The electrical connections made by using the bumps of the structure according to the further other embodiment of the present invention can have a higher reliability.

According to further other embodiments of the present invention, a structure including a substrate that includes a set of pads formed on a surface thereof; and a set of bumps formed on the pads is provided. Each bump is fabricated by: forming a bump base on each pad, which has a tip extending outwardly from the corresponding pad; and filling conductive material into a set of holes of a resist layer patterned on the substrate, each of which is aligned with the corresponding pads and has space surrounding the tip of the bump bases formed on the corresponding pad.

The electrical connections made by using the bumps of the structure according to the further other embodiment of the present invention can have higher reliability owing from the high aspect ratio of the bumps and the sufficient amount of conductive material.

In a preferable embodiment, the conductive material is solder material and solidified in each hole and the set of the bumps is a set of solder capped bumps, each of which is made of the material of bump bases formed on the substrate and the solder material filled into the hole. Since the amount of the solder material in the bump is expected to be sufficient, higher reliability of the electrical connections can be expected even though no pre-solder is formed. Furthermore, it becomes easier to have solder composition optimized in terms of mechanical characteristics and/or resistance for electro-migration at electrical connections.

According to further other embodiments of the present invention, an electronic device includes a semiconductor device that includes a set of pads formed on a surface thereof; external circuitry that has a set of electrodes formed on a surface thereof; and a set of joints electrically connecting the pads of the semiconductor device with the electrodes of the external circuitry, respectively. The joints are made by mounting, to the external circuitry, the semiconductor device in a form having a set of bumps formed on the pads, in which each bump includes bump base material and conductive material formed thereon, the bump base material has at least a part protruding outwardly from the corresponding pad into the conductive material and the conductive material has a round top and a straight sidewall.

The electrical connections between the semiconductor device and the external circuitry in the electronic device according to the further other embodiment of the present invention can have a higher reliability.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

DETAILED DESCRIPTION

Now, the present invention will be described using particular embodiments, and the embodiments described hereafter are understood to be only referred to as examples and are not intended to limit the scope of the present invention.

One or more embodiments according to the present invention are directed to a method of fabricating bumps on a substrate, an associated structure, an associated electronic device, and an associated method of interconnecting a semiconductor device with external circuitry by bumps, in which a high aspect ratio of the bumps can be achieved in a cost effective manner.

Figure 1A:
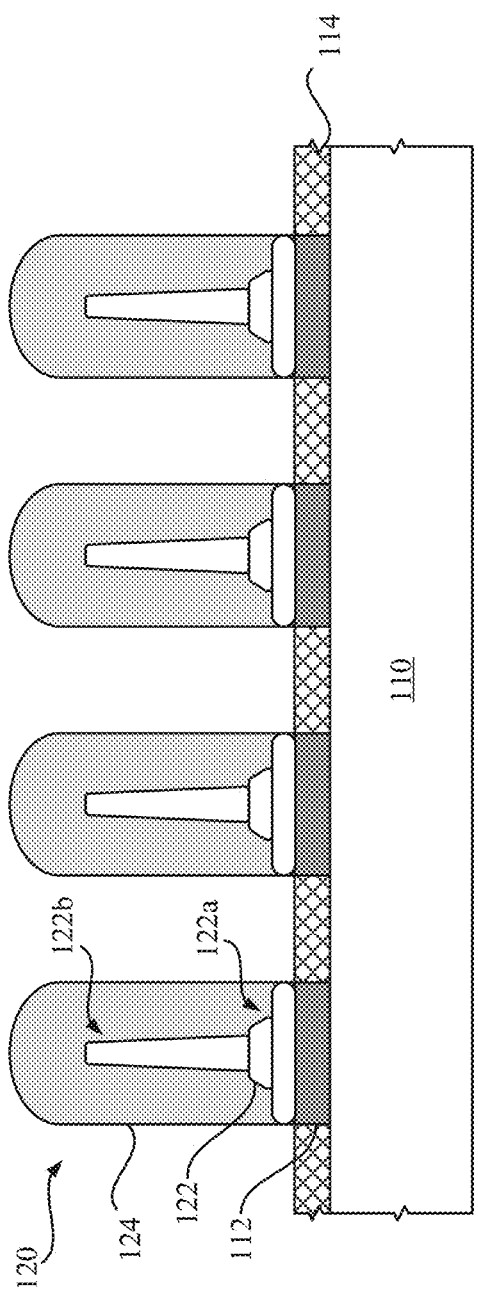
FIGS. 1A and 1B illustrate a cross-sectional view and a top view of a bumping structure according to an exemplary embodiment of the present invention, respectively.
Figure 1B:
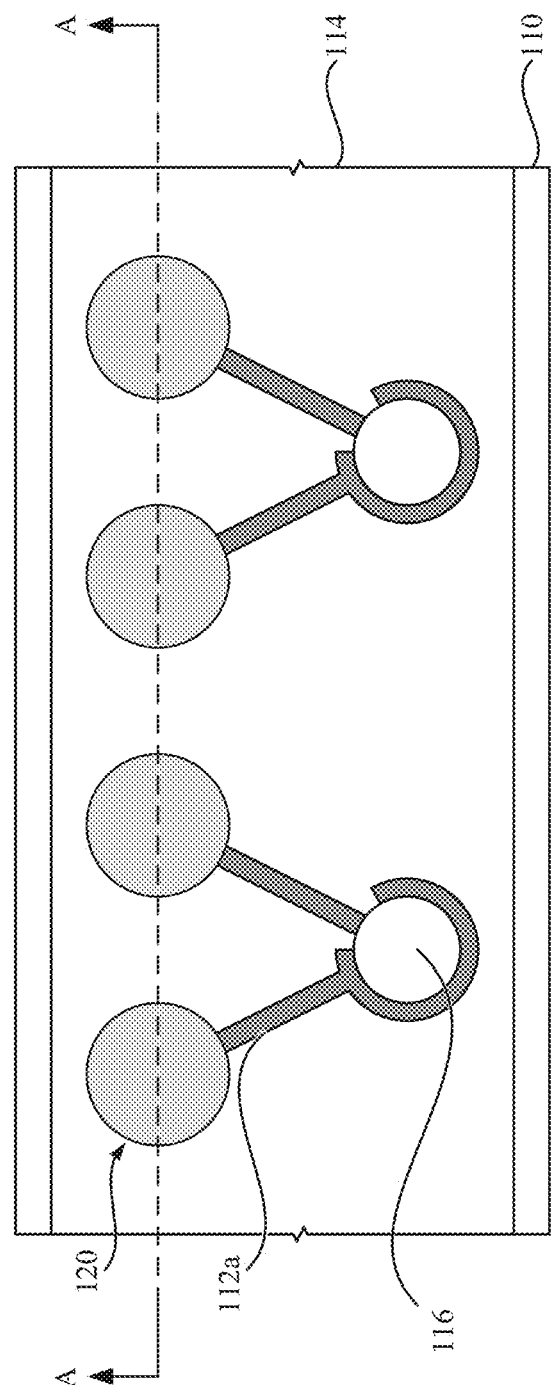

Hereinafter, with reference to FIGS. 1A and 1B, a bumping structure according to an exemplary embodiment of the present invention will be described. FIG. 1A illustrates a cross-sectional view of a bumping structure 100. FIG. 1B shows a top view of the bumping structure 100. Note that the cross-sectional view shown in FIG. 1A corresponds to a cross-section indicated by the arrow "A" in the top view shown in FIG. 1B.

The bumping structure 100 shown in FIG. 1 includes a substrate 110 including a set of pads 112 and a passivation layer 114 formed on a surface of the substrate 110; and a set of bumps 120 formed on the substrate 110 at respective locations of the pads 112. Note that reference numerals related to the bump are indicated in relation to only one representative bump in the figure instead of all elements, for convenience.

The substrate 110 may be a substrate made of semiconductor material. In a particular embodiment, the substrate 110 is a wafer, with microelectronic devices built in and finally separated into plural chips, or a chip separated from the wafer. Both of the wafer and the chip are semiconductor devices. The wafer and the chip may be made of silicon, III-V or II-VI compound semiconductor materials or other semiconductor materials. The wafer and the chip may be fabricated by any standard semiconductor processes, including FEOL (Front End Of Line) and BEOL (Back End Of Line) processes.

Each pad 112 is made of conductive material such as Al or Cu. In the described embodiment, there is no ball limiting metallurgy (BLM) on the pads 112. However, in other embodiments, BLM may be provided on the pads 112. The pads 112 may be located on the surface of the substrate 110 with certain pitch (e.g., 20-300 micrometers).

As shown in FIG. 1B, the substrate 110 may have optoelectronic elements 116 such as photodiodes (PDs) and light emitting diodes (LEDs), and a trace 112a connected to the bump 120. Thus, the bumping structure 100 shown in FIGS. 1A and 1B corresponds to an optoelectronic chip, which can be incorporated into an optical multi-chip module (optical MCM). However, the bumping structure is not limited to that for the optoelectronic chip. In other embodiments, the bumping structure may correspond to any other semiconductor devices including IC (Integrated Circuit) chip, microelectromechanical systems chip, to name but a few.

FIG. 1A also depicts a more detailed structure of each bump 120. As shown in FIG. 1A, each bump 120 includes bump base material 122 and conductive material 124 formed on the bump base material 122. The bump base material 122 has a body part 122a and a tip part 122b that protrudes outwardly from the body part 122a and the corresponding pad 112 into the conductive material 124.

In a preferable embodiment, the bump base material 122 is made from a stud bump that has a body and a tip narrower than the body. In one or more particular embodiments, each stud bump may be, but not limited to, selected from the group consisting of an Au (including pure metal and its alloys, the same below) stud bump, a bare Cu stud bump, a Pd-coated Cu stud bump and an Ag stud bump.

The conductive material 124 is solder material that may have any appropriate composition. In one or more embodiments, any of lead-free solder alloys including binary, ternary and quaternary systems of one or more elements selected from a group consisting of tin, bismuth, silver, indium, antimony, copper, zinc, nickel, aluminum, manganese and palladium, may be used. Such a lead-free solder alloys may include Bi—Sn, Sn—Ag, Sn—Ag—Bi, Sn—Ag—Cu, Sn—Cu alloys, to name but a few. With the high degree of freedom regarding composition, any composition suitable for the bumping can be selected.

Hereinafter, referring to FIGS. 2A-2E, a bumping process for fabricating bumps on a substrate according to an exemplary embodiment of the present invention will be described. FIGS. 2A-2E illustrate cross-sectional views of a structure obtained at each step of the bumping process. The bumps 120 shown in FIGS. 1A and 1B can be fabricated by the bumping process described in FIGS. 2A-2E.

Figure 2A:
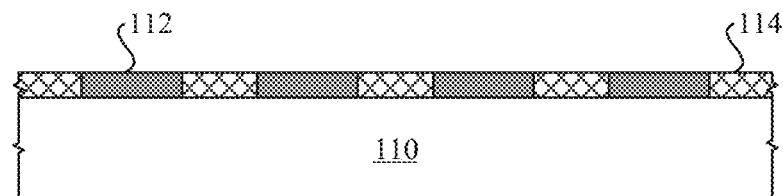
FIGS. 2A, 2B, 2C, 2D and 2E illustrate cross-sectional views of a structure obtained at each step of a bumping process according to an exemplary embodiment of the present invention.

As shown in FIG. 2A, the bumping process may include a step of preparing a substrate 110 that includes the set of the pads 112 and the passivation layer 114 formed on the surface of the substrate 110. In a particular embodiment, the bumping process according to the exemplary embodiment of the present invention is performed as a wafer level process, and the substrate 110 is a wafer, in which integrated circuits built.

Figure 2B:
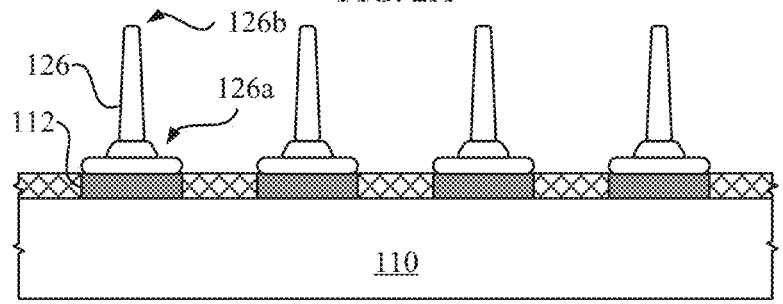

As shown in FIG. 2B, the bumping process may also include a step of forming a bump base 126 on each pad 112 of the substrate 110. Each bump base 126 has a body 126a and a tip 126b extending outwardly from the corresponding pad 112. The bump base 126 may extend the tip 126b in a direction approximately normal to the surface of the substrate 110. The tip 126b of the bump base 126 may be narrower than the body 126a to have a tapered shape. In a preferable embodiment, the bump base 126 is a stud bump that can be formed by wire bonding process. In one or more particular embodiments, the stud bump may be, but not limited to, selected from the group consisting of an Au stud bump, a bare Cu stud bump, a Pd-coated Cu stud bump and an Ag stud bump.

In a standard wire bonding process to form stud bumps on pads, a high voltage arc may be applied to one end of a metal wire that is threaded through a wire-bonder capillary to form a small ball at the one end of the metal wire. Then, the ball at the one end of the metal wire may be brought into the substrate 110, and bonded to the pad 112 by using ultrasonic energy that creates friction between the ball and the pad 112. The wire-bonder capillary is then retracted, breaking off the wire and leaving the stud bump with certain length on the pad 112. The height of the stud bump can be controlled by the break point of the wire, which may be influenced by the position of recrystallization boundary. The diameter of the metal wire may define the size of the tip 126*b*. The diameter of the metal wire may range from 10 um (microns) to 70 um.

Optionally, the bumping process may include a step of flattening the tip 126*b* of the bump bases 126 by coining. However, the flattening step may be omitted when forming a solder cap with a high aspect ratio. In this case, the tip 126*b* of the bump base 126 may have a pointed form.

Figure 2C:
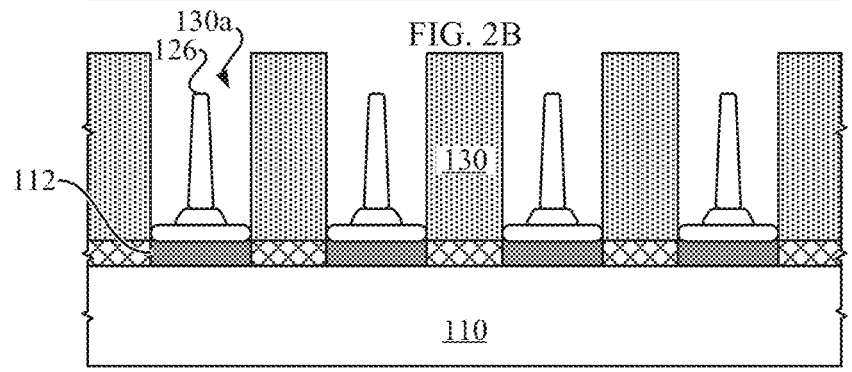

As shown in FIG. 2C, the bumping process may further include a step of patterning a resist layer 130 on the substrate 110 to have a set of holes 130*a* formed through the resist layer 130. Each hole 130*a* may be aligned with a corresponding pad 112 that is formed on the substrate 110, and, in the described embodiment, has space surrounding the tip 126*b* of the bump base 126 that is formed on the corresponding pad 112.

The resist layer 130 may be patterned by virtually any standard means including photolithography. In a particular embodiment, the step of patterning the resist layer 130 on the substrate 110 may include a sub-step of applying photoresist material on the substrate 110, preferably, without interposing any seed layer therebetween. Such a seed layer is generally deposited onto a substrate when electroplating Cu to form a pillar on a pad. Any of known liquid photoresists may be used for the photoresist material. The step of patterning the resist layer 130 on the substrate 110 may further include a sub-step of exposing and developing the photoresist material so as to open holes through the photoresist material with aligning with the pads 112.

The resist layer 130 may has a designed thickness that can provide an adequate height for bumping that is used with target external circuitry. In a preferable embodiment, the resist layer 130 has a thickness that is aligned to the levels of the tips 126*b* of the bump bases 126. In other words, the bump bases 126 may be formed so as to have the tips 126*b* at levels that are almost same as the designed thickness of the resist layer 130.

Furthermore, the diameter of the hole 130*a* may influence the size of the bump 120 finally obtained. In one embodiment, the diameter of the hole 130*a* may be in a range from about 10 micrometers to about 150 micrometers. Also, the space of the hole 130*a* that surrounds the tip 126*b* of the bump bases 126 may provide room to accommodate the conductive material that would be filled by a subsequent filling step. Thus, in a preferable embodiment, the hole 130*a* has a designed diameter that is larger than the twice of the size of the tip 126*b* of the bump bases 126, which may correspond to the diameter of the metal wire for the stud bump fabrication in a particular embodiment, in a manner depending on a desired bump size. That is, the bump bases 126 may be formed so as to have tips 126*b* narrower than the diameter of the hole 130*a*, giving sufficient space surrounding the tip 126*b* of the bump bases 126.

Figure 2D:
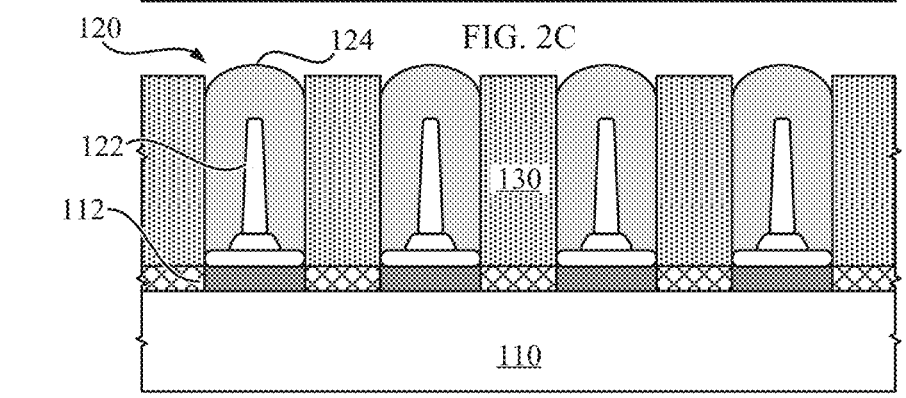

As shown in FIG. 2D, the bumping process may include further a step of filling the set of the holes 130*a* with the conductive material 124 to form a set of bumps 120 on the substrate 110. The space of the hole 130*a* surrounding the tip 126*b* of the bump bases 126 may be filled with the conductive material by the filling step. Each obtained bump 120 includes bump base material 122, which originates from the bump bases 126 that is formed at the step shown in FIG. 2B, and the conductive material 124 formed on the bump base material 122.

In the described embodiment, each hole 130*a* is filled with the conductive material 124 by IMS process. In the IMS process, a molten solder is injected into each hole 130*a* under a vacuum or reduced pressure condition by using a fill head that traverses the substrate 110, and solidified in each hole 130*a*. The fill head includes a reservoir of the molten solder and a slot through which the molten solder is injected into the hole 130*a*. Since the tip 126*b* of each bump base 126 has been formed to extend outwardly from the corresponding pads 112, the tip 126*b* would touch the molten solder that is injected from the fill head at the beginning of the filling process for each hole 130*a*, making it easier for the molten solder to wet the top of the tip 126*b* and enter the hole 130*a*. Therefore, filling yield of the solder material in the holes 130*a* is expected to be improved. When the thickness of the resist layer 130 is aligned to the levels of the tip 126*b* of the bump bases 126, the filling yield of the solder material may be expected to be further improved.

Furthermore, the bumps 120 can have appropriate solder composition since each bump 120 is fabricated by injecting the molten solder, which can be selected with the high degree of freedom regarding composition. Thus, the bumping process shown in FIGS. 2A-2E has also an ability to control the solder composition readily. Therefore, it becomes easier to optimize the solder composition of the he bumps 120 to improve mechanical characteristics and/or resistance for electro-migration at electrical connections.

Figure 2E:
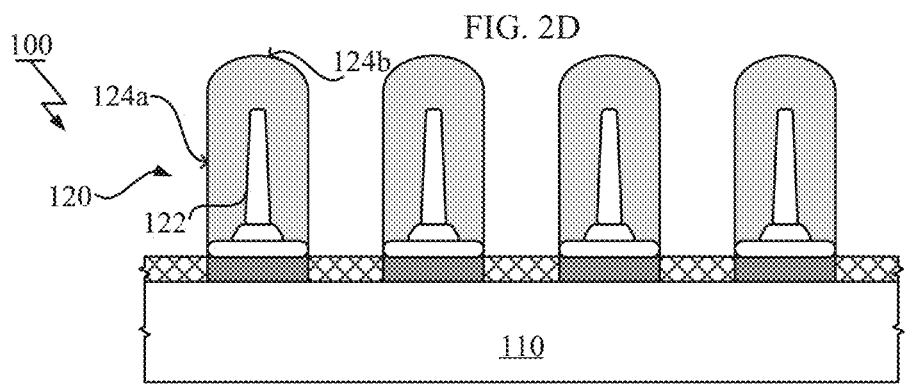

As shown in FIG. 2E, the bumping process may include a step of stripping the resist layer 130 from the substrate 110 with leaving the set of the bumps 120 on the substrate 110.

According to the bumping process shown in FIGS. 2A-2E, the set of the bumps 120 is fabricated by forming the bump base 126 on each pad 112, and by filling the conductive material 124 into the set of the hole 130*a* of the resist layer 130 that is patterned on the substrate 110. The bumps 120 finally obtained have relatively higher aspect ratio.

Each bump 120 may have a form of a solder capped bump, and may be made of material of the bump base 126 that has been formed on the substrate 110 and the conductive material 124 that has been filled into the hole 130*a* of the resist layer 130. The bump base material 122 has at least a part protruding outwardly from the corresponding pad 112 into the conductive material 124, which may originate from the tip 126*b* of the bump base 126. The conductive material 124 of the bumps 120 obtained by the bumping process shown in FIGS. 2A-2E has a round top 124*b* and a straight sidewall 124*a* sidewall vertically rising from the bump base material 122. Thus, additional reflow can be made unnecessary, which helps fine pitch.

In FIG. 1A and FIGS. 2D and 2E, it is illustrated that the shape of the bump base material 122 after the filling step is same as the shape of the bump base 126. However, a part of the bump base 126 may be diffused into the conductive material 124 and the shape of the bump base 126 may deform during the filling process in a manner depending on conditions, which may include the material of the bump base 126 and the size of the tip 126*b*.

Figure 3A:
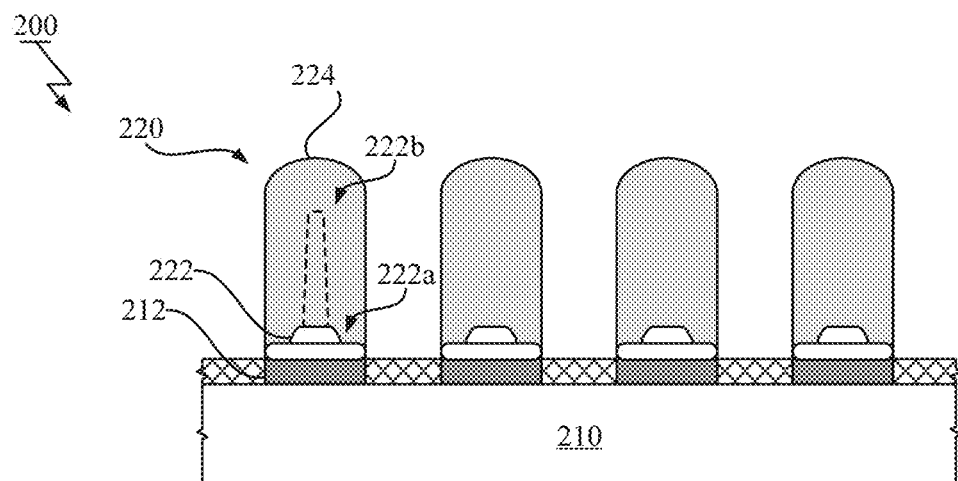
FIGS. 3A, 3B and 3C show cross-sectional views of various structures obtained by using bump bases of various materials and solder material according to one or more particular embodiment of the present invention.
Figure 3B:
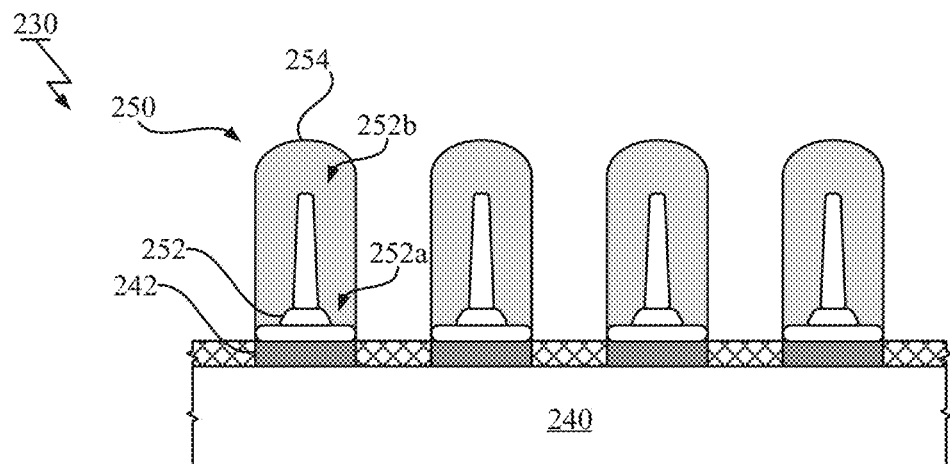
Figure 3C:
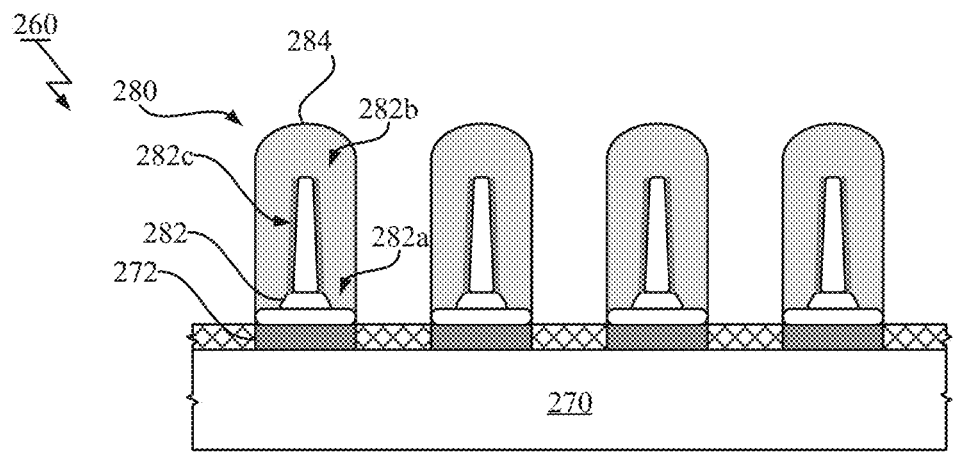

With reference to FIGS. 3A-3C, various structures obtained by using bump bases of various materials and the solder material will be described.

FIG. 3A shows a cross-sectional view of a bumping structure 200 that is expected to be obtained when using Au stud bumps, which may be formed by using Au wire of relatively narrower diameter. As shown in FIG. 3A, there is a set of bumps 220 formed on a substrate 210 at respective locations of pads 212. Each bump 220 includes bump base material 222 and solder material 224 formed on the bump base material 222.

Each bump base material 222 is made from the Au stud bump. As illustrated in FIG. 3A, the bump base material 222 has a body part 222a, but the tip part 222b that have existed before the filling step may be at least partially diffused into the solder material 224 since Au element is known to be diffused into Sn relatively fast. However, preferably, the bump base material 222 may still have a part protruding outwardly from the corresponding pad 212 into the solder material 224, which may originate from the tip of the Au stud bump, even though the Au stud bumps are used.

FIG. 3B shows a cross-sectional view of a bumping structure 230 that is expected to be obtained when using Cu stud bumps instead of using the Au stud bumps. As shown in FIG. 3B, there is a set of bumps 250 formed on a substrate 240 at respective locations of pads 242. Each bump 250 includes bump base material 252 and solder material 254 formed on the bump base material 252.

Each bump base material 252 is made from the Cu stud bump. As illustrated in FIG. 3B, the bump base material 252 has a body part 252a and a tip part 252b protruding outwardly from the body part 252a into the solder material 254. A part of the bump base material 252 may be diffused into the solder material 254 but the bump base material 252 is allowed for maintaining its shape well against the diffusion since the diffusion of Cu element into Sn is relatively slow. Thus, it becomes easier for the bump 250 to keep their shape of high aspect ratio during a subsequent chip joining process in comparison with the case using Au stud bumps. When using bare Cu stud bumps to form the bump base material 252, the surface of the bare Cu stud bump would be oxidized to lower the solderability. Thus, the surface oxide of the bare Cu stud bump is preferably removed by oxide removal process such as the acid washing before the filling step.

FIG. 3C shows a cross-sectional view of a bumping structure 260 that is expected to be obtained when using Pd-coated Cu stud bumps instead of using the bare Cu stud bumps. As shown in FIG. 3C, there is a set of bumps 280 formed on a substrate 270 at respective locations of pads 272. Each bump 280 includes bump base material 282 and solder material 284 formed on the bump base material 282.

Each bump base material 282 is made from the Pd-coated Cu stud bump, which has a Pd coating layer 282c formed on a surface thereof as a protection layer. As illustrated in FIG. 3C, the bump base material 282 has a body part 282a and a tip part 282b protruding outwardly from the body part 282a into the solder material 284. The bump base material 282 is allowed for maintaining its shape well against the diffusion into the solder material 284. Also, since the surface of the bump base material 282 is protected by the Pd coating layer 282c from oxidation, which originates from the Pd-coated Cu stud bumps, the good wettability for the molten solder can be obtained even though surface oxide removal process is omitted.

As mentioned above, in several examples of the structures obtained from the various bump bases, preferably, the bump base material may have at least a part protruding outwardly from the corresponding pad into the solder material, which provides some help to keep their shape of high aspect ratio during the subsequent chip joining process.

Hereinafter, with reference to FIGS. 4A and 4B and FIG. 5, an electronic device according to an exemplary embodiment of the present invention will be described.

Figure 4A:
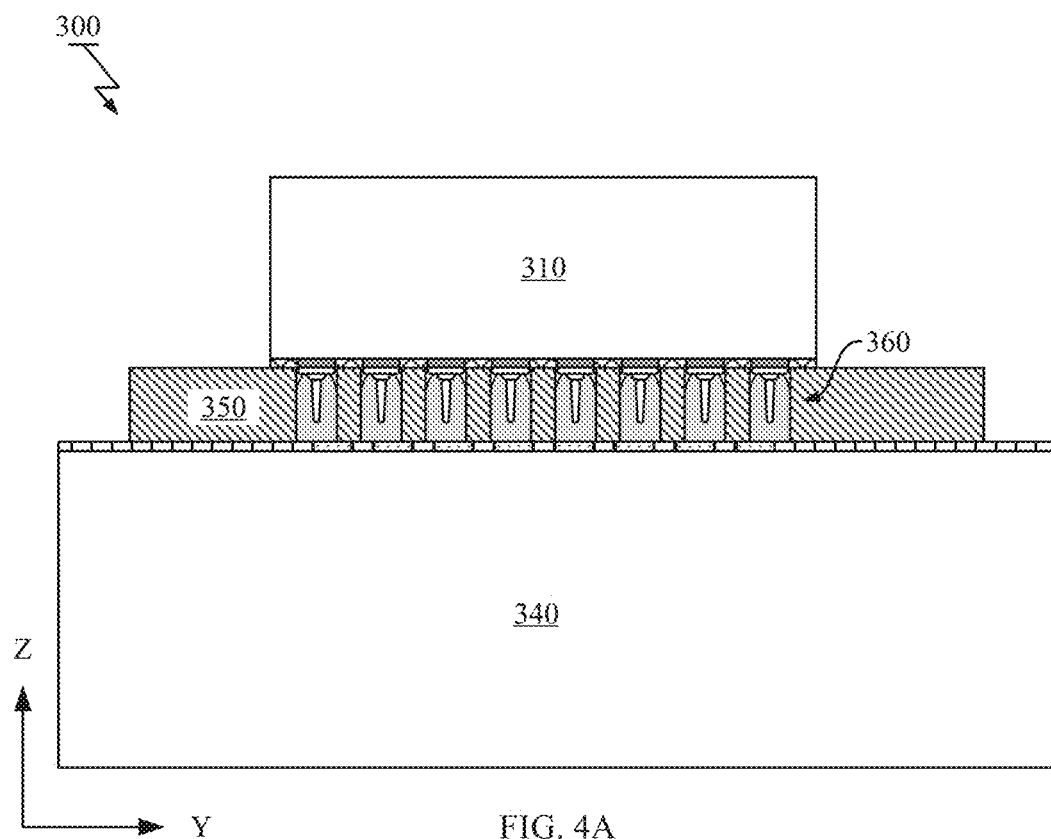
FIGS. 4A and 4B illustrate cross-sectional views of an electronic device, according to an exemplary embodiment of the present invention, when viewed from different directions.
Figure 4B:
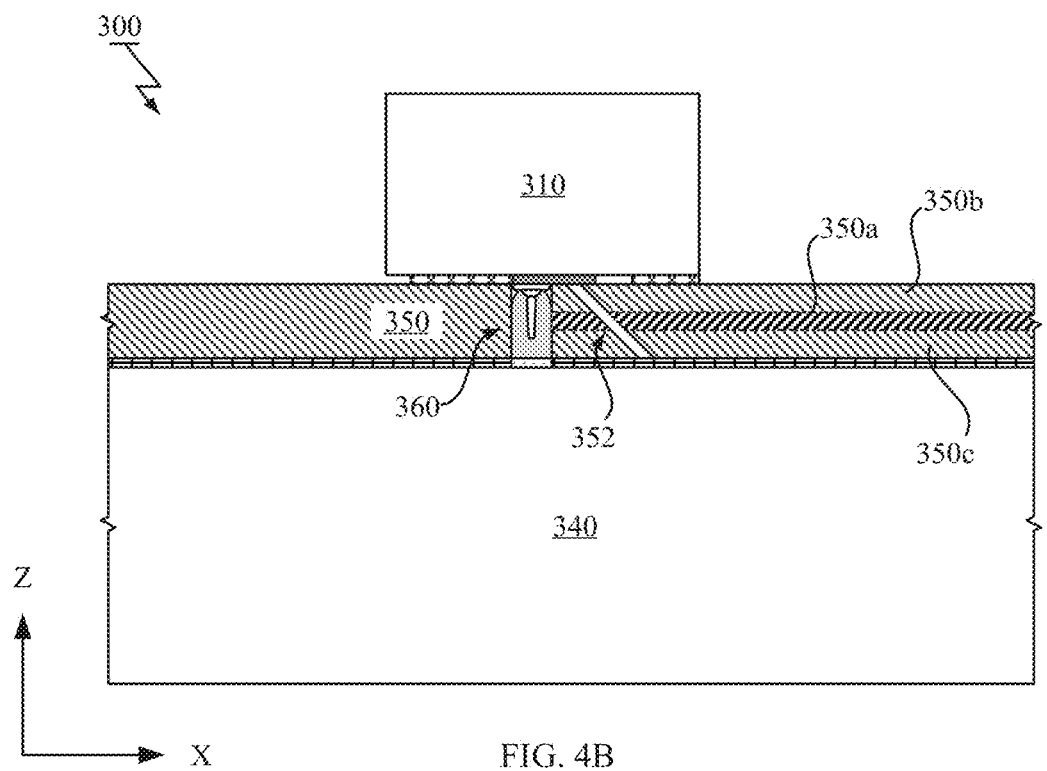

FIG. 4A and FIG. 4B illustrate cross-sectional views of an electronic device 300 when viewed from different directions. The electronic device 300 shown in FIGS. 4A and 4B includes an optoelectronic chip 310, an organic substrate 340 and flip-chip joints 360 that are formed between the optoelectronic chip 310 and the organic substrate 340 by using the aforementioned bumping structure 100. FIG. 5 shows an enlarged cross-sectional view around the flip-chip joints 360 formed in the electronic device 300.

Note that, in the described embodiment, the external circuitry is provided as a form of an organic substrate with an optical waveguide integrated thereon. However, the external circuitry to which the chip is mounted is not limited to the waveguide integrated organic substrate. In other embodiment, the external circuitry may be provides as a form of a circuit board, another chip, a wafer or a silicon interposer, to name but a few.

As shown in FIGS. 4A and 4B, the optoelectronic chip 310 is mounted on the organic substrate 340 that has a waveguide layer 350 formed on the top surface thereof. The flip-chip joints 360 are made between the optoelectronic chip 310 and the organic substrate 340 with the waveguide layer 350 interposed therebetween. As shown in FIG. 4B, the waveguide layer 350 may be a polymer waveguide that includes a core 150a and upper and lower claddings 150b, 150c. There is a slant slit 352 so as to provide a mirror like facet that launches a beam passing from the core 150a into the optoelectronic chip 310, and/or vice versa.

Figure 5:
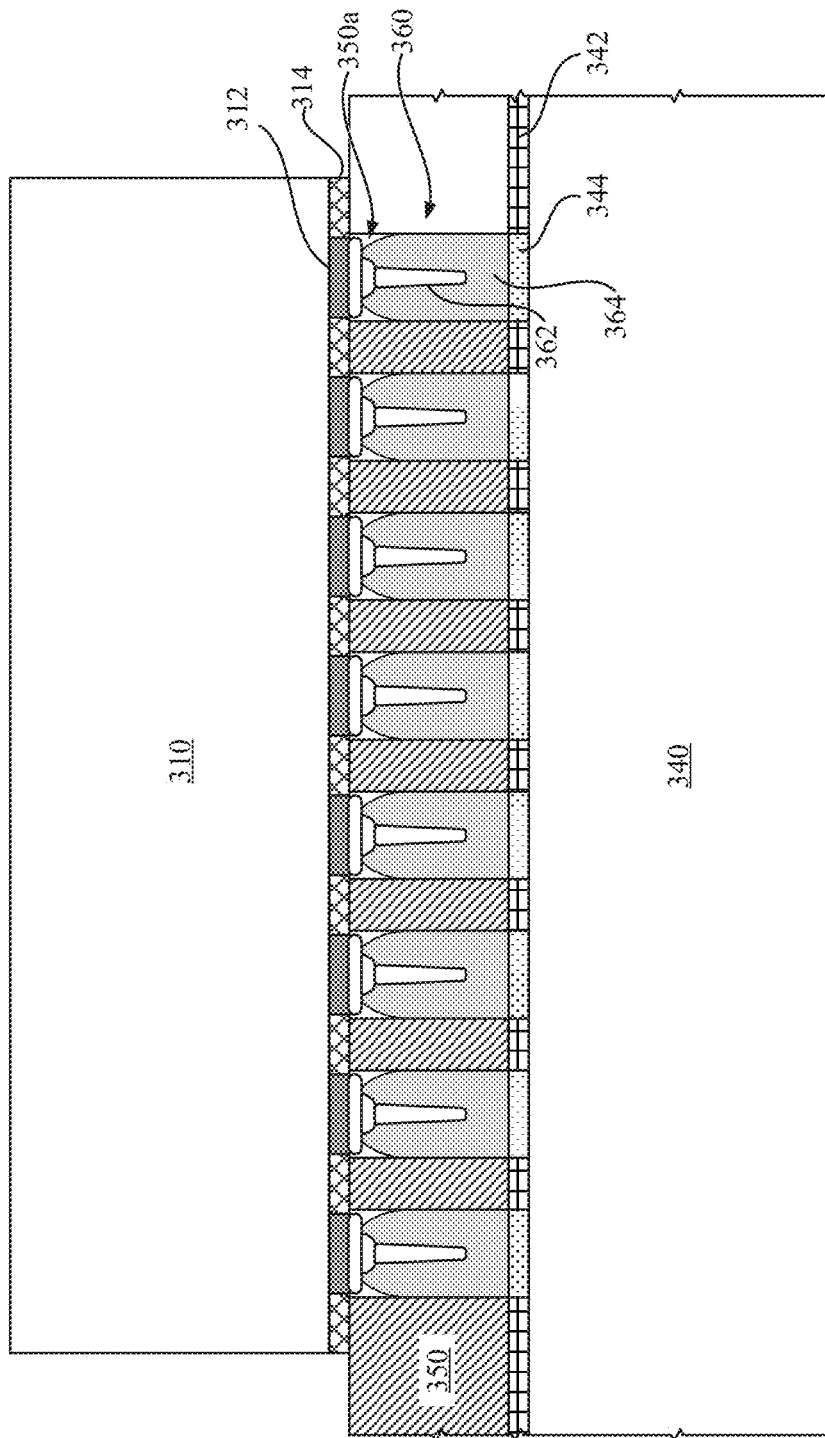
FIG. 5 shows an enlarged cross-sectional view around flip-chip joints formed in the electronic device according to the exemplary embodiment of the present invention.

In FIG. 5, a more detailed structure around the flip-chip joints 360 is depicted. As shown in FIG. 5, there are a set of pads 312 and a passivation layer 314 on the surface of the optoelectronic chip 310, whereas there are a solder resist layer 342 and a set of electrodes 344 on the surface of the organic substrate 340. The electrodes 344 may be an outermost layer of the organic substrate 340 and electrically connected to the circuitry that is embedded in the organic substrate 340. Note that the internal layer structure in the organic substrate 340 is omitted from the drawings for the purpose of illustration.

The waveguide layer 350 may be formed on the solder resist layer 342, and have a set of via holes 350a, each of which is aligned with the corresponding electrode 344. Each via hole 350a receives the flip-chip joints 360 that includes bump base material 362 and conductive material 364. The waveguide layer 350 may have a relatively large thickness (e.g. 75 um), and accordingly the flip-chip joint 360 has adequate height such that each flip-chip joint 360 electrically connects the corresponding pad 312 on the optoelectronic chip 310 with the corresponding electrode 344 on the organic substrate 340. The bump base material 362 may have a part that protrudes outwardly from the corresponding pad 312 into the conductive material 364.

Figure 6A:
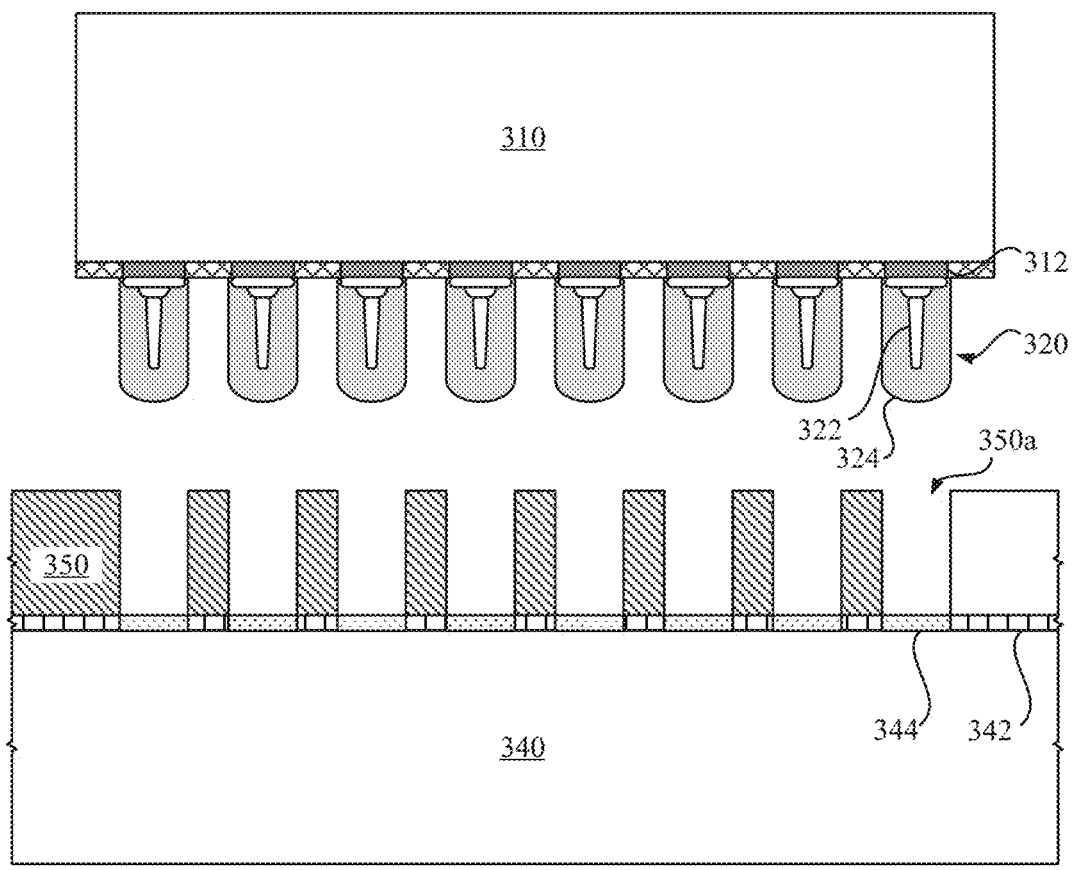
FIGS. 6A and 6B illustrate cross-sectional views of a structure obtained at each step of a flip-chip process according to an exemplary embodiment of the present invention.
Figure 6B:
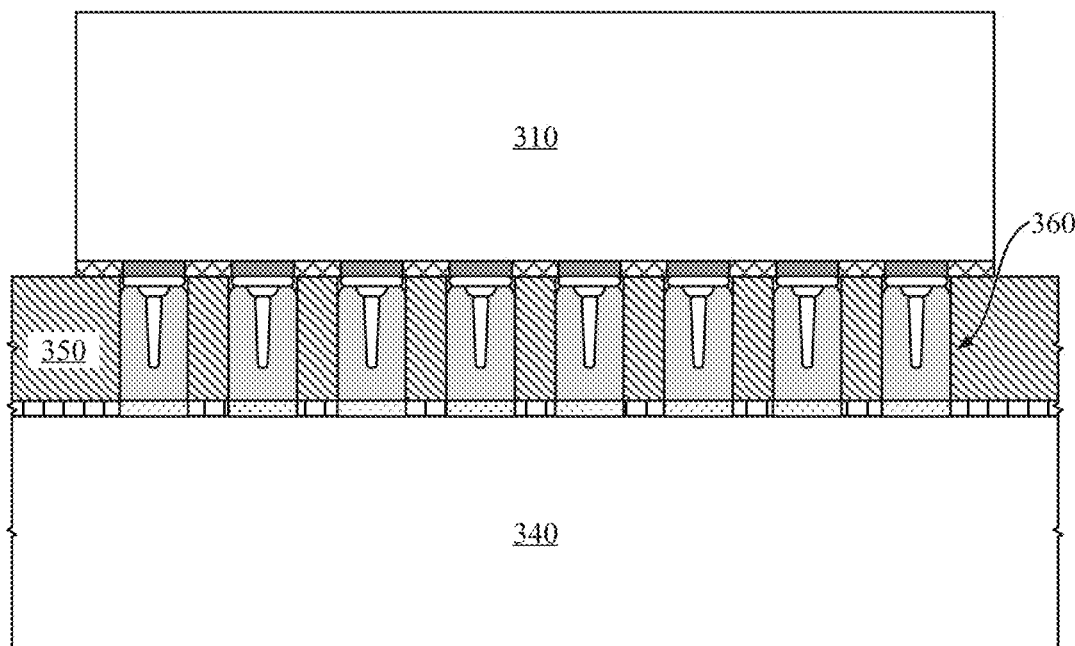

Hereinafter, referring to FIGS. 6A and 6B, a flip-chip process for interconnecting an optoelectronic chip with an organic substrate by bumps according to an exemplary embodiment of the present invention will be described. FIGS. 6A and 6B illustrate cross-sectional views of a structure obtained at each step of the flip-chip process. The electronic device 300 shown in FIGS. 4A and 4B can be fabricated by the flip-chip process described in FIGS. 6A and 6B.

As shown in FIG. 6A, the flip-chip process may include a step of preparing an optoelectronic chip 310 that includes a set of pads 312 formed on the surface thereof and a set of bumps 320 formed on the pads 312. The flip-chip process may also include a step of preparing an organic substrate 340 that includes a set of electrodes 344 formed on a surface thereof. In a particular embodiment, aforementioned bumping process and dicing process may be performed to a wafer to prepare the optoelectronic chip 310. As already described with reference to FIGS. 1A and 1B, each bump 320 includes bump base material 322 and conductive material 324 formed thereon. The bump base material 322 has at least a part protruding outwardly from the corresponding pad 312 into the conductive material 324. As illustrated in FIG. 6A, the conductive material 324 of the optoelectronic chip 310 that has been prepared at this step has a straight sidewall and a round top. The organic substrate 340 has a waveguide layer 350 having a set of via holes 350a aligned with the electrodes 344. Since the waveguide layer 350 may have a relatively large thickness and the joints are made through the via holes 350a, thus, the bumps 320 preferably has an adequate height that can provide the sufficient joints with the organic substrate 340 through the waveguide layer 350.

As shown in FIG. 6B, the flip-chip process may include a step of mounting the optoelectronic chip 310 to the organic substrate 340 such that the bumps 320 are in contact with the electrodes 344, respectively. The optoelectronic chip 310 is flipped over so that its top side faces down, and aligned so that the bumps 320 align with the electrodes 344 on the organic substrate 340. When mounting, the bumps 320 of the optoelectronic chip 310 are inserted into the respective via holes 350a in the waveguide layer 350, respectively. In the mounting step, there is no pre-solder on the electrodes 344 of the organic substrate 340. Instead of forming pre-solder, the surface of the electrodes 344 may be subjected to the Ni/Au electroplating or the OSP (Organic Solderability Preservative) process to improve surface wettability for the solder.

As also shown in FIG. 6B, the flip-chip process may further include a step of bonding the bumps 320 with the electrodes 344, respectively, to obtain the flip-chip joints 360. Appropriate one of the mount and reflow method and the thermal compression method by a bonder may be selected depending on desired size and pitch of the joints. Since the flip-chip joints 360 are made in the respective via holes 350a in the waveguide layer 350, lateral spreading of the solder material can be suppressed.

The process according to the aforementioned embodiments can fabricate bumps on a substrate with a higher aspect ratio in a cost effective manner. The electrical connections made by using the bumps according to the aforementioned embodiments can have a higher reliability owing from the high aspect ratio of the bumps and the sufficient amount of conductive material in the bumps. Since the amount of the conductive material in the bump is expected to be sufficient, higher reliability of the electrical connections can be expected.

Hereinafter, with reference to a series of FIGS. 7A-7D and FIGS. 8A-8C, related flip-chip process using stud bumps and micro solder ball placement as well as its disadvantage will be described.

FIGS. 7A-7D illustrate cross-sectional views of a structure obtained at each step of a related flip-chip process using stud bumps and micro solder ball placement.

At the beginning of the related flip-chip process, an organic substrate 540 having a waveguide layer 550 is prepared. Via holes 550a may be formed through the waveguide layer 550 at respective locations of electrode 544 that are formed on the surface of the organic substrate 540.

Generally, application of the pre-solder on the electrodes of the organic substrate may be conducted by a solder paste printing method. However, in the case of the optical MCM as illustrated in FIG. 4B, the solder paste printing method, which is a process of filling the via holes with solder material fully may not be applicable. Because there is a gap of the slant slit in the waveguide layer at the vicinity of the via hole for the flip-chip joint, this results in a risk that solder will flow into the gap. Also, making the chip surface close to the optical waveguide makes it difficult to apply solder paste printing method.

Figure 7A:
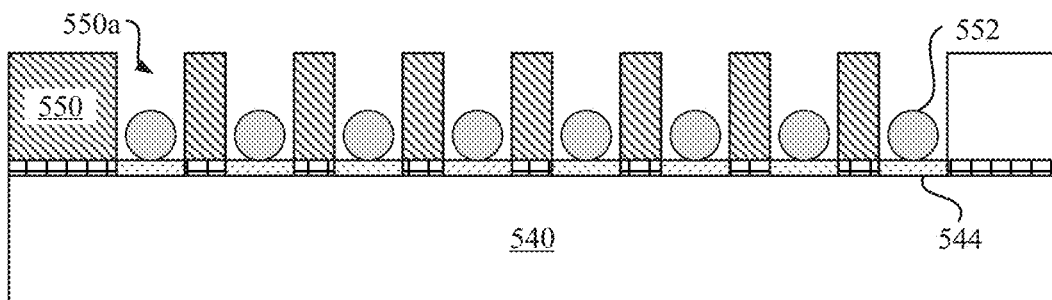
FIGS. 7A, 7B, 7C and 7D illustrate cross-sectional views of a structure obtained at each step of a related flip-chip process using stud bumps and micro solder ball placement.
Figure 7B:
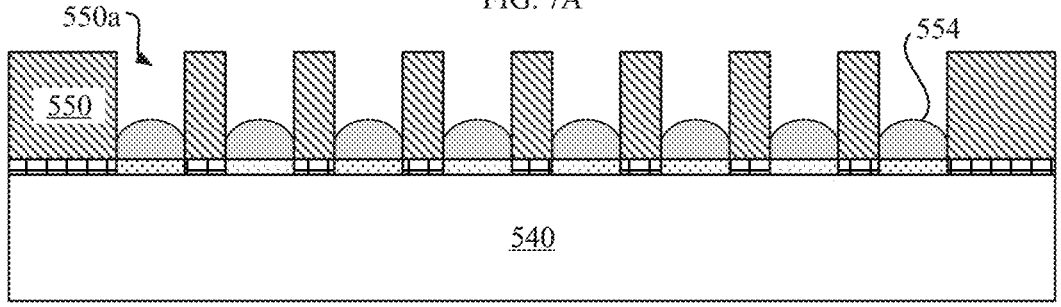
Figure 7C:
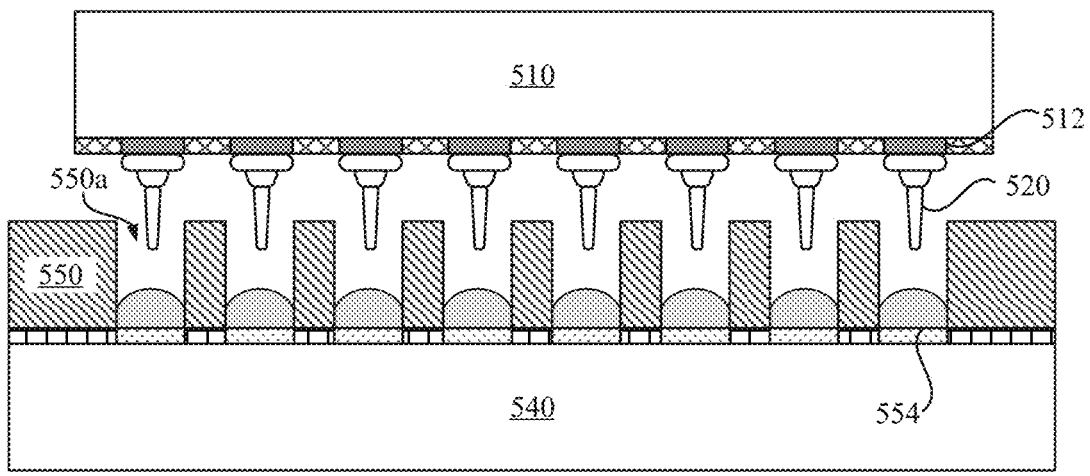
Figure 7D:
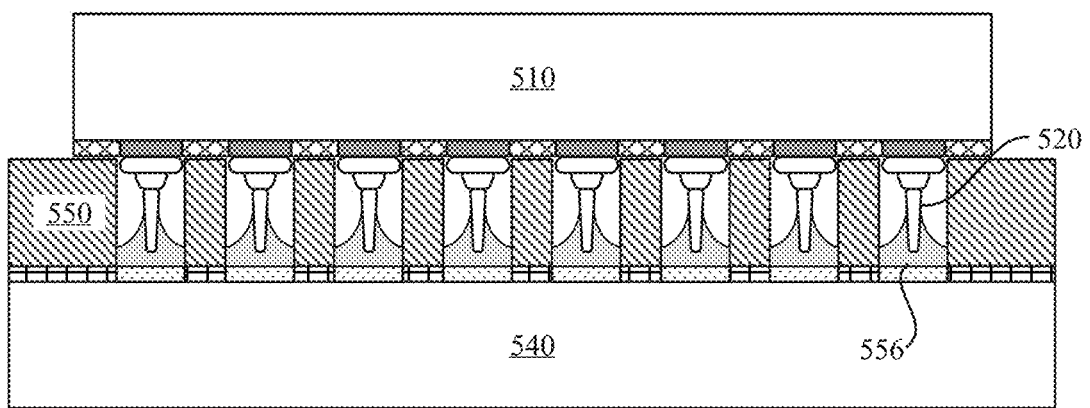

One option for avoiding aforementioned difficulty may be a micro solder ball placement. As shown in FIG. 7A, in the related flip-chip process, micro-solder balls 552 are placed into the via holes 550a. As shown in FIG. 7B, the micro-solder balls 552 are subjected to reflow to form pre-solders on the electrodes 544. As shown in FIG. 7C, then, a chip 510 having stud bumps 520 is prepared. As shown in FIG. 7D, the chip 510 is mounted to the organic substrate 540 to form joints between the stud bumps 520 and the pre-solders 556.

Figure 8A:
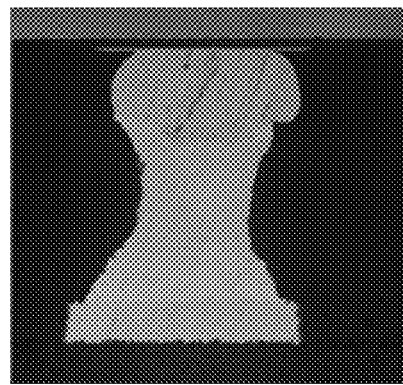
FIGS. 8A, 8B and 8C depict examples of a solder joint and broken joints obtained by the related flip-chip process.
Figure 8B:
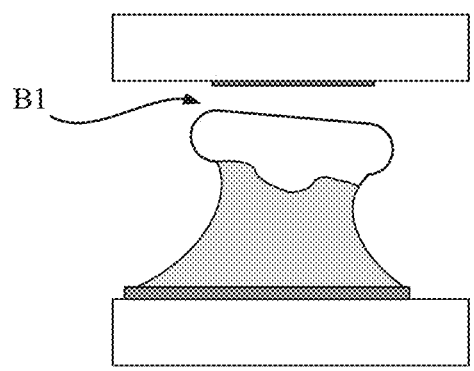
Figure 8C:
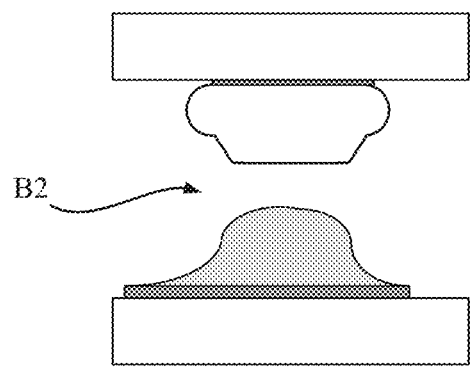

Since the size of the micro-solder balls 552 that can be placed into the via holes 550a is limited, it is difficult to make the amount of the solder material in the pre-solder 554 sufficient, resulting in the joints having a shape narrowed in the middle after the flip-chip joining process, as depicted in FIG. 8A. Such flip-chip joints are fragile to breakage due to thermal stress as indicated by B1 and B2 in FIGS. 8B and 8C.

In contrast to the related flip-chip process shown in FIGS. 7A-7D, according some of the aforementioned embodiments, the amount of the solder material in the bump is expected to be sufficient, resulting in higher reliability of electrical connections using the bumps even though no pre-solder is formed. Thereby, the production cost of the bumps can be reduced since expensive micro-solder ball and ball placement process that is difficult to control yield can be made unnecessary.

Hereinafter, with reference to a series of FIGS. 9A-9E, FIGS. 10A-10D, FIGS. 11A-11C and FIGS. 12A-12D, various related bumping processes will be described.

FIGS. 9A-9E illustrate cross-sectional views of a structure obtained at each step of a related bumping process that includes electroplating of copper pillars and IMS of solder caps.

Figure 9A:
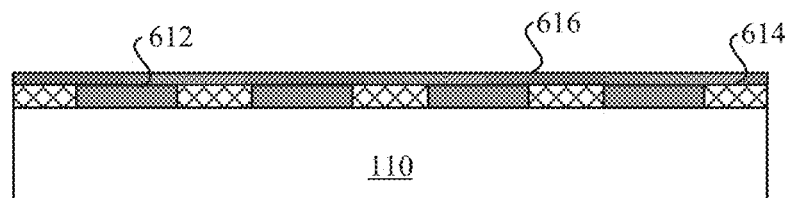
FIGS. 9A, 9B, 9C, 9D and 9E illustrate cross-sectional views of a structure obtained at each step of a related bumping process that includes electroplating of copper pillars and IMS of solder caps.
Figure 9B:
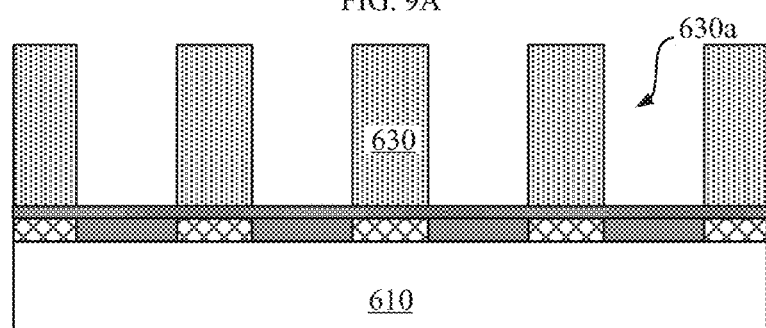
Figure 9C:
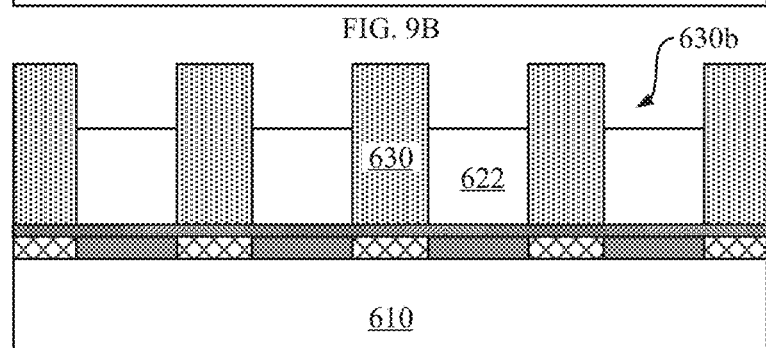
Figure 9D:
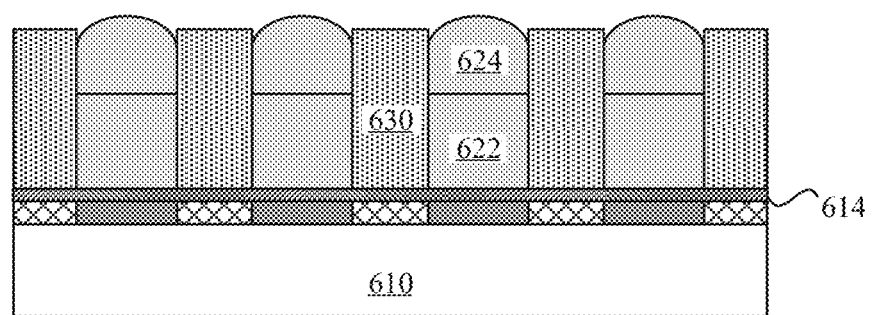
Figure 9E:
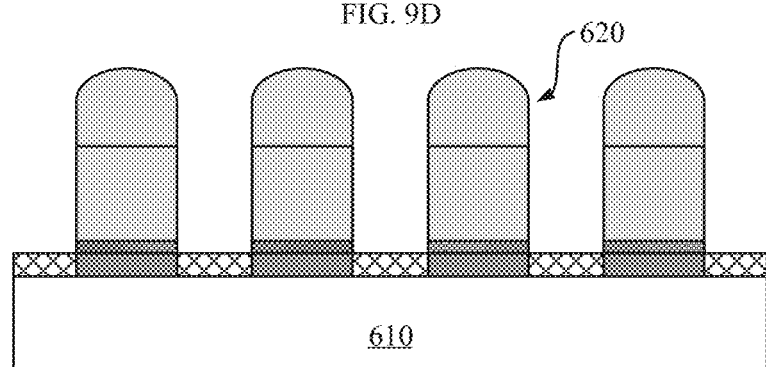

As shown in FIG. 9A, in the related bumping process, a seed layer 616 such as Ti/Cu layer is formed on a surface of a wafer 610, which includes a set of pad 612 and a passivation layer 614. As shown in FIG. 9B, a mask 630 having a set of holes 630a is disposed on the wafer 610. As shown in FIG. 9C, Cu is electroplated on the seed layer 616 in the holes 630a to form Cu pillars up to the middle of the holes 630a. As shown in FIG. 9D, remaining portions of the holes 630a in the mask 630 are filled with the solder material by IMS process to form a set of solder cap 624 on the Cu pillar 622. As shown in FIG. 9E, the mask 630 is removed from the wafer 610 and the seed layer 616 is etched, leaving the Cu pillar 622 with the solder cap 624 on the wafer 610.

It is difficult to form a solder high on the Cu pillar by the related bumping process shown in FIG. 9A-9E. Even though void free is known to be generally expected with the IMS technology, the related bumping process suffers from a difficulty that solder filling is encumbered by the residual gas in the high aspect hole in the mask, resulting in a low solder filling yield. The residual gas in the holes prevents the solder from reaching the pillar and wetting on the top face of the pillar. Also, a lack of solderability on the inner surface of the holes prevents the solder from entering the hole. Even though the Cu pillar can raise the height of the bump, however, the amount of the solder material that can be obtained by the related bumping process shown in FIG. 9A-9E is insufficient. When a ratio of a part forming inter-metallic compound (IMC) with respect to the whole volume becomes relatively larger due to the insufficient amount of the solder material, the joint becomes brittle and easily breaks. Furthermore, by the bumping process shown in FIG. 9A-9E, expensive electroplating of a Cu pillar, expensive facility and complicated management of the plating process are needed.

In contrast to the related bumping process shown in FIGS. 9A-9E, according some of the aforementioned embodiments, there is a bump base that has a tip extending outwardly from each pad, in which the tip is surrounded by the space of the hole. Thus, the tip of the bump base in the hole would touch the molten solder at the beginning of filling the corresponding hole, making it easier for the molten solder to wet the top of the tip and enter the space of the hole. Therefore, filling yield of the solder material in the holes is expected to be improved.

FIGS. 10A-10D illustrate cross-sectional views of a structure obtained at each step of other related bumping process including electroplating of copper pillars and solder caps.

Figure 10A:
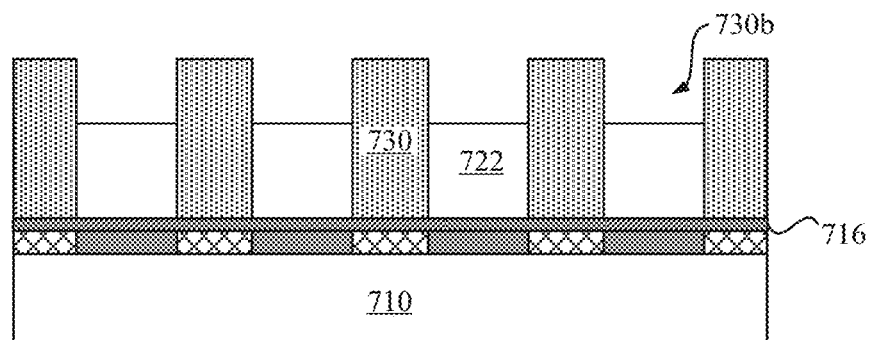
FIGS. 10A, 10B, 10C and 10D illustrate cross-sectional views of a structure obtained at each step of another related bumping process that includes electroplating of copper pillars and solder caps.
Figure 10B:
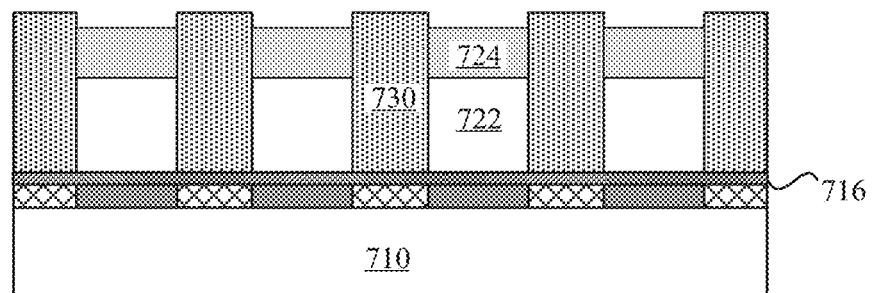
Figure 10C:
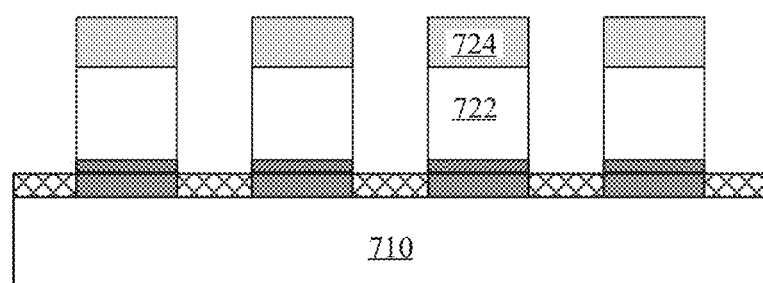
Figure 10D:
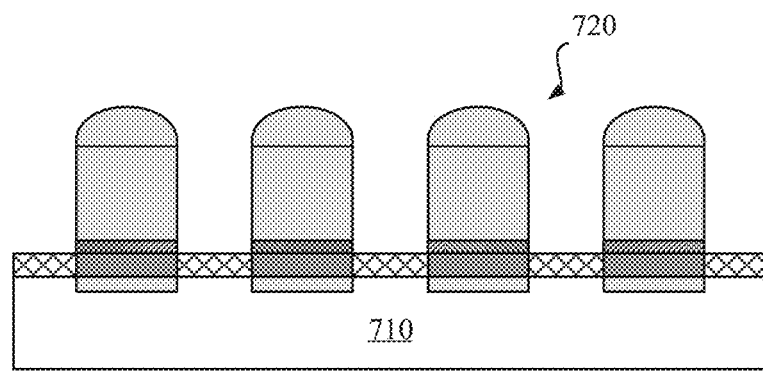

As similar to FIGS. 9A-9E, in the related bumping process shown in FIG. 10A-10D, Cu is electroplated on a seed layer 716 to form a Cu pillar 722 up to a middle of holes 730a in a mask 730, as shown in FIG. 10A. As shown in FIG. 10B, a solder layers 724 is deposited on the Cu pillars 722 by electroplating the solder material up to upper bound of the holes 730b in the mask 630. As shown in FIG. 10C, the mask 730 is removed from the wafer 710 and the seed layer 716 is etched, leaving the Cu pillar 722 with the solder layer 724 on the wafer 710. As shown in FIG. 10D, the solder layer 724 is then subjected to reflow with flux to form a solder capped bump 720 on the wafer 710 to avoid the formation of voids at an interface during final flip-chip joining process.

However, it is difficult to form a solder high on the pillar by the related bumping process shown in FIGS. 10A-10D. Also it is difficult to tune the composition of the electroplated solder with the high degree of freedom regarding composition. Merely pure Sn or binary solder composition is known to be stably fabricated by electroplating methods. Furthermore, if the volume of the solder material is larger with respect to the radius of the Cu pillar, the process suffers from a difficulty that the solder will spill from the top of the pillar when melting during the reflow. Also, as similar to the process shown in FIGS. 9A-9E, the amount of the solder material is insufficient. Also, the expensive electroplating, the expensive facility and the complicated management of the plating process are needed.

In contrast to the related bumping process shown in FIGS. 10A-10D, according to some of the aforementioned embodiments, the bumps can have appropriate solder composition since each bump is fabricated by injecting the molten solder, which can be selected with the high degree of freedom regarding composition. Therefore, it becomes easier to optimize the solder composition of the bumps to improve mechanical characteristics and/or resistance for electro-migration at electrical connections.

Figure 11A:
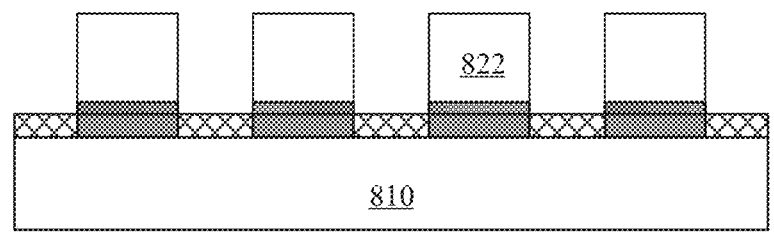
FIGS. 11A, 11B and 11C illustrate cross-sectional views of a structure obtained at each step of further other related bumping processes that include electroplating of copper pillars and transferring of solder caps.
Figure 11B:
Figure 11C:
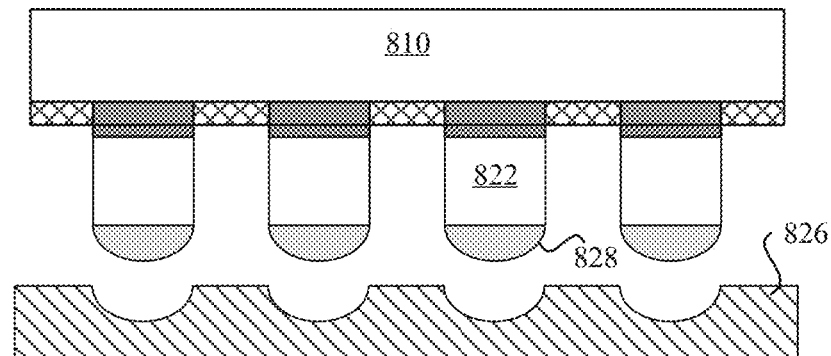

FIGS. 11A-11C illustrate cross-sectional views of a structure obtained at each step of further other related bumping processes including electroplating of copper pillars and transferring of molded solder caps.

As similar to FIGS. 9A-9C and FIG. 10A, in the related bumping process shown in FIGS. 11A-11C, a Cu pillar 822 is fabricated on a wafer 810 as shown in FIG. 11A. As shown in FIG. 11B, solder caps 328 are fabricated by IMS process with a glass mold 826 that has a tiny cavity etched into the glass substrate. The cavities are filled with solder material during scanning. As shown in FIG. 11C, the fabricated solder caps 828 are then transferred onto the Cu pillar 822 by heating the glass mold 826 and the wafer 810 in formic acid vapor to activate the pillar and the solder surface, resulting in the Cu pillar 822 with the solder cap 828 on the wafer 810.

However, the related bumping process shown in FIGS. 11A-11C needs the additional transferring process in addition to the injection process, making it difficult to make the bumps fine pitched due to difficulty in alignment. It is also difficult to form a high volume solder on the pillar. The related bumping process uses formic acid. Also, as similar to the process shown in FIGS. 9A-9E, the expensive electroplating, the expensive facility and the complicated management of the plating process are needed for fabricating Cu pillars.

Figure 12A:
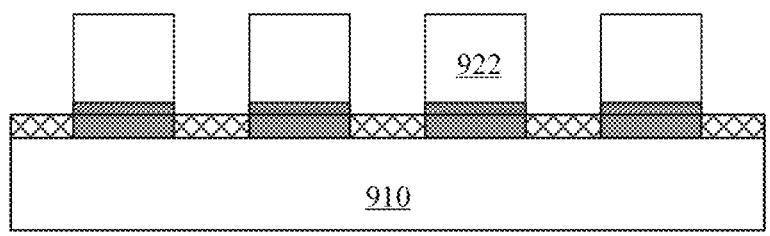
FIGS. 12A, 12B, 12C and 12D illustrate cross-sectional views of a structure obtained at each step of another related bumping process that includes electroplating of copper pillars and micro-ball mounting for solder caps.
Figure 12B:
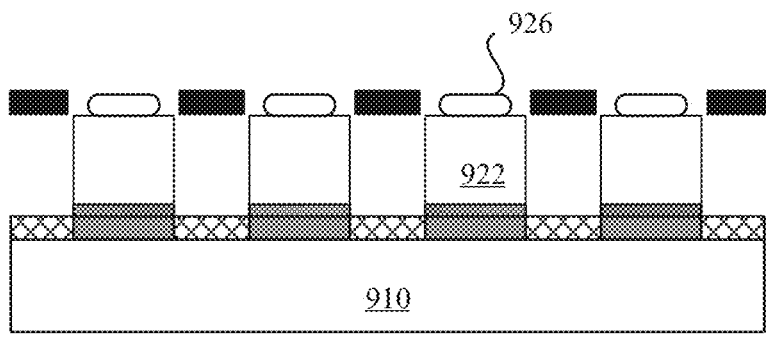
Figure 12C:
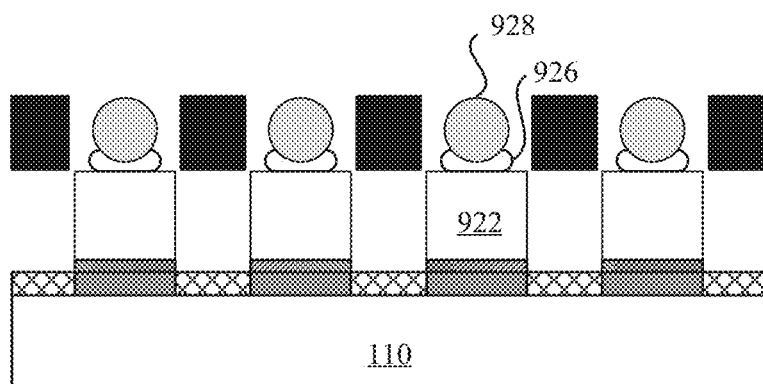
Figure 12D:
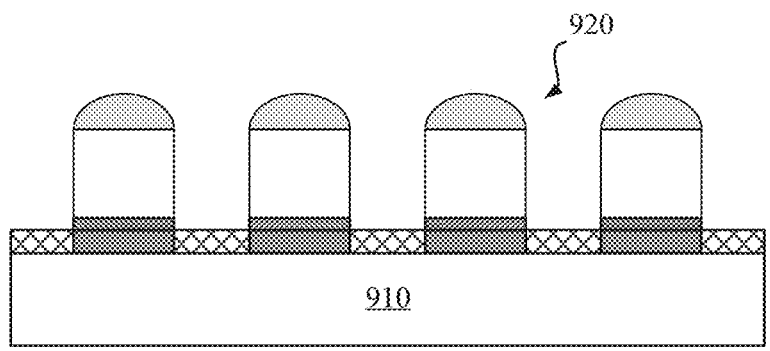

FIGS. 12A-12C illustrate cross-sectional views of a structure obtained at each step of another related bumping process including electroplating of copper pillars and microball mounting for solder caps.

As similar to FIGS. 9A-9C, FIG. 10A and FIG. 11A, in the related bumping process shown in FIG. 12A-12D, a Cu pillar 922 is fabricated on a wafer 910, as shown in FIG. 12A. As shown in FIG. 12B, tacky flux 926 is dispensed on each Cu pillar 922 by using a mask. As shown in FIG. 12C, a solder ball 928 is dispensed on the Cu pillars 922 and the tacky flux using a mask. As shown in FIG. 12C, the solder ball 928 attached on the Cu pillar may be subjected to reflow to form a solder capped bump 920 on the wafer 910 and cleaning.

However, it is difficult to form a solder high on the pillar by the related bumping process shown in the FIG. 12A-12C. Also, as similar to the process shown in FIGS. 9A-9E, if the volume of the solder material is larger with respect to the radius of the Cu pillar, the process suffers from a difficulty that the solder will spill from the top of the pillar when melting by the reflow. Also, the amount of the solder material is insufficient, and the expensive electroplating, the expensive facility and the complicated management of the plating process are required.

In contrast to the aforementioned related bumping processes shown in FIGS. 9A-9E, FIGS. 10A-10D, FIGS. 11A-11C and FIGS. 12A-12D, in a preferable embodiment where each bump base is a stud bump formed by wire bonding, the production cost of the bumps can be reduced since expensive electroplating of a pillar base can be made unnecessary and complicated management of the plating process can be omitted.

As described above, according to one or more embodiments of the invention, a high aspect ratio of the bumps can be achieved in a cost effective manner while keeping reliability of electrical connections using the bumps.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for interconnecting a semiconductor device with external circuitry by bumps, the method comprising:
   preparing a semiconductor device including a set of pads formed adjacent a passivation layer in a non-overlapping manner, and a set of bumps formed thereon, each bump including bump base material and conductive material formed thereon, the conductive material encompassing an entirety of each bump, the bump base material having at least a part protruding outwardly from the corresponding pad into the conductive material, the conductive material having a round top and a straight sidewall;
   preparing external circuitry having a set of electrodes formed on a surface thereof; and
   mounting the semiconductor device to the external circuitry such that the bumps of the semiconductor device are in contact with the electrodes of the external circuitry, respectively.

2. The method of claim 1, wherein the conductive material is a solder material and the set of the bumps is a set of solder capped bumps, each being made of the bump base material and the solder material.

3. The method of claim 1, wherein each the bump base material originates from a stud bump.

4. The method of claim 3, wherein each stud bump is selected from the group consisting of an Au stud bump, a bare Cu stud bump, a Pd-coated Cu stud bump and an Ag stud bump.

5. The method of claim 1, wherein the external circuitry has a layer having a set of via holes aligned with the electrodes, the bumps of the semiconductor device are inserted into the via holes of the external circuitry, respectively, when mounting the semiconductor device to the external circuitry.

6. The method of claim 5, wherein the external circuitry is provided as a form of an organic substrate having an optical waveguide integrated thereon as the layer having the via holes.

7. The method of claim 1, wherein the semiconductor device is mounted to the external circuitry without forming a pre-solder on each electrode of the external circuitry.

8. A structure comprising:
   a semiconductor device including a set of pads formed adjacent a passivation layer in a non-overlapping manner; and
   a set of bumps formed on the pads, each bump including bump base material and conductive material formed thereon, the conductive material encompassing an entirety of each bump, the bump base material having at least a part protruding outwardly from the corresponding pad into the conductive material, the conductive material having a round top and a straight sidewall.

9. The structure of claim 8, wherein the bumps of the semiconductor device is a set of solder capped bumps each being made of the bump base material and solder material.

10. The structure of claim 8, wherein each the bump base material originates from a stud bump.

11. The structure of claim 10, wherein each stud bump is selected from the group consisting of an Au stud bump, a bare Cu stud bump, a Pd-coated Cu stud bump and an Ag stud bump.

12. The structure of claim 8, further comprising:
    external circuitry is provided as a form of an organic substrate having an optical waveguide integrated thereon as the layer.

13. An electronic device comprising:
    a semiconductor device including a set of pads formed adjacent a passivation layer in a non-overlapping manner;
    external circuitry having a set of electrodes formed on a surface thereof; and
    a set of joints electrically connecting the pads of the semiconductor device with the electrodes of the external circuitry, respectively, the joints being made by:
    mounting, to the external circuitry, the semiconductor device in a form having a set of bumps formed on the pads, each bump including bump base material and conductive material formed thereon, the conductive material encompassing an entirety of each bump, the bump base material having at least a part protruding outwardly from the corresponding pad into the conductive material, the conductive material having a round top and a straight sidewall.

14. The electronic device of claim 13, wherein the external circuitry has a layer having a set of via holes aligned with the electrodes, the via holes of the external circuitry receive the joints, respectively.

15. The electronic device of claim 14, wherein the external circuitry is provided as a form of an organic substrate having an optical waveguide integrated thereon as the layer.

16. The electronic device of claim 13, wherein the bumps of the electronic device is a set of solder capped bumps each being made of the bump base material and solder material.

17. The electronic device of claim 13, wherein each the bump base material originates from a stud bump.

18. The electronic device of claim 17, wherein each stud bump is selected from the group consisting of an Au stud bump, a bare Cu stud bump, a Pd-coated Cu stud bump and an Ag stud bump.

19. The electronic device of claim 13, wherein the external circuitry is provided as a form of an organic substrate having an optical waveguide integrated thereon as the layer having the via holes.

20. The electronic device of claim 13, wherein the electronic device is mounted to the external circuitry without forming a pre-solder on each electrode of the external circuitry.

* * * * *